(12) United States Patent
Balakrishnan et al.

(10) Patent No.: US 9,786,739 B2
(45) Date of Patent: Oct. 10, 2017

(54) STACKED NANOSHEETS BY ASPECT RATIO TRAPPING

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/228,153

(22) Filed: Aug. 4, 2016

(65) Prior Publication Data
US 2017/0170269 A1     Jun. 15, 2017

Related U.S. Application Data

(62) Division of application No. 14/964,122, filed on Dec. 9, 2015, now Pat. No. 9,425,291.

(51) Int. Cl.
| | |
|---|---|
| H01L 29/78 | (2006.01) |
| H01L 29/06 | (2006.01) |
| H01L 29/20 | (2006.01) |
| H01L 29/04 | (2006.01) |
| H01L 29/417 | (2006.01) |
| H01L 29/423 | (2006.01) |

(52) U.S. Cl.
CPC ........ *H01L 29/0676* (2013.01); *H01L 29/045* (2013.01); *H01L 29/20* (2013.01); *H01L 29/41733* (2013.01); *H01L 29/42356* (2013.01)

(58) Field of Classification Search
None
See application file for complete search history.

(56) References Cited

U.S. PATENT DOCUMENTS

| | | | |
|---|---|---|---|
| 8,154,082 B2 * | 4/2012 | Moriyama | B82Y 10/00 257/351 |
| 8,748,940 B1 | 6/2014 | Rachmady et al. | |
| 8,753,942 B2 | 6/2014 | Kuhn et al. | |
| 8,765,563 B2 | 7/2014 | Pillarisetty et al. | |
| 8,785,909 B2 | 7/2014 | Radosavljevic et al. | |
| 9,018,680 B2 | 4/2015 | Dewey et al. | |

(Continued)

OTHER PUBLICATIONS

List of IBM Patents or Patent Applications Treated As Related Dated Aug. 4, 2016, 2 Pages.

*Primary Examiner* — Ali Naraghi
(74) *Attorney, Agent, or Firm* — Scully, Scott, Murphy & Presser, P.C.; Louis J. Percello, Esq.

(57) ABSTRACT

A semiconductor structure is provided that includes a plurality of suspended and stacked nanosheets of semiconductor channel material located above a pillar of a sacrificial III-V compound semiconductor material. Each semiconductor channel material comprises a semiconductor material that is substantially lattice matched to, but different from, the sacrificial III-V compound semiconductor material, and each suspended and stacked nanosheets of semiconductor channel material has a chevron shape. A functional gate structure can be formed around each suspended and stacked nanosheet of semiconductor channel material.

16 Claims, 21 Drawing Sheets

(56) References Cited

U.S. PATENT DOCUMENTS

| | | |
|---|---|---|
| 9,023,705 B1 * | 5/2015 | Paul ............... H01L 21/823431 438/283 |
| 9,029,834 B2 | 5/2015 | Bangsaruntip et al. |
| 9,087,863 B2 | 7/2015 | Cea et al. |
| 9,425,291 B1 * | 8/2016 | Balakrishnan .... H01L 29/66795 |
| 2011/0049568 A1 | 3/2011 | Lochtefeld et al. |
| 2013/0270512 A1 | 10/2013 | Radosavljevic et al. |
| 2013/0279145 A1 | 10/2013 | Then et al. |
| 2014/0091279 A1 | 4/2014 | Kachian et al. |
| 2014/0353574 A1 | 12/2014 | Li et al. |
| 2015/0126008 A1 | 5/2015 | Paul et al. |
| 2015/0380481 A1 | 12/2015 | Cappellani et al. |

* cited by examiner

STACKED NANOSHEETS BY ASPECT RATIO TRAPPING

BACKGROUND

The present application relates to semiconductor technology. More particularly, the present application relates to a semiconductor structure including stacked semiconductor nanosheets and a method of forming the same.

The use of non-planar semiconductor devices such as, for example, fin field effect transistors (FinFETs) is the next step in the evolution of complementary metal oxide semiconductor (CMOS) devices. Fin field effect transistors (FinFETs) can achieve higher drive currents with increasingly smaller dimensions as compared to conventional planar FETs. As scaling continues, further improvements over conventional FinFETs are required. For example, there is a need for providing non-planar semiconductor devices that have improved electrostatic characteristics as compared to FinFETs and increased device width per footprint area.

SUMMARY

In one aspect of the present application, a semiconductor structure is provided. In one embodiment, the semiconductor structure includes a plurality of suspended and stacked nanosheets of semiconductor channel material located above a pillar of a sacrificial III-V compound semiconductor material. Each semiconductor channel material comprises a semiconductor material that is substantially lattice matched to, but different from, the sacrificial III-V compound semiconductor material, and each suspended and stacked nanosheet of semiconductor channel material has a chevron shape.

In another aspect of the present application, a method of forming a semiconductor structure is provided. In one embodiment of the present application, the method includes providing a plurality of trench dielectric material portions located on a surface of a semiconductor substrate portion, wherein each trench dielectric material portion is separated from one another by an aspect ratio trapping trench. Next, a semiconductor pillar structure is formed within each aspect ratio trapping trench, wherein each semiconductor pillar structure includes alternating layers of a sacrificial III-V compound semiconductor material and a semiconductor channel material. Each trench dielectric material portion is then recessed to expose each layer of the semiconductor channel material. A plurality of sacrificial gate structures is then formed on portions of each semiconductor pillar structure, wherein a dielectric spacer is present on each sidewall of each sacrificial gate structure. Next, exposed portions of each semiconductor pillar structure not covered by the sacrificial gate structure and the dielectric spacer are removed to provide a plurality of semiconductor nanosheet structures including a remaining portion of the alternating layers of sacrificial III-V compound semiconductor material and semiconductor channel material. Each sacrificial gate structure is then removed. Each remaining portion of each semiconductor channel material of each semiconductor nanosheet structure is then suspended.

Figure 12:
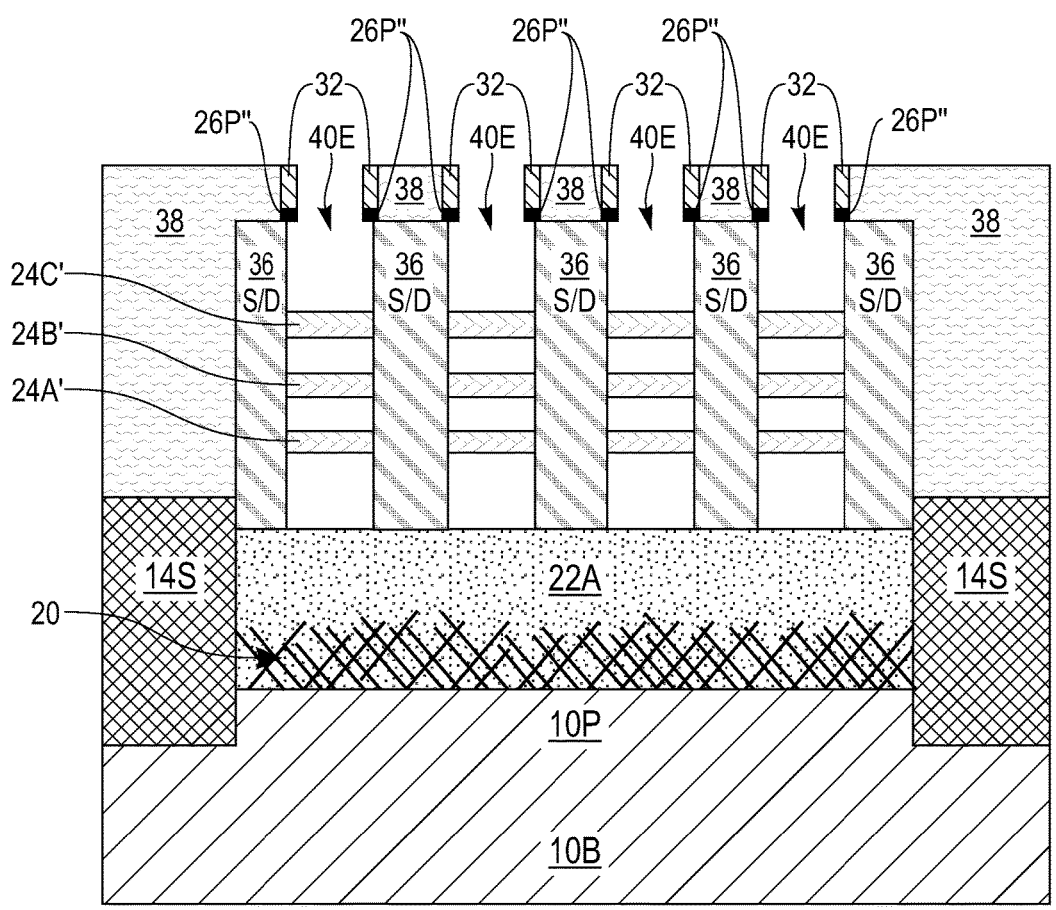
FIG. 12 is a cross sectional view (parallel to one of the fins) of the exemplary semiconductor structure of FIG. 11 after removing each remaining portion of the sacrificial III-V compound semiconductor material to provide suspended and stacked nanosheets of the semiconductor channel material.
Figure 14:
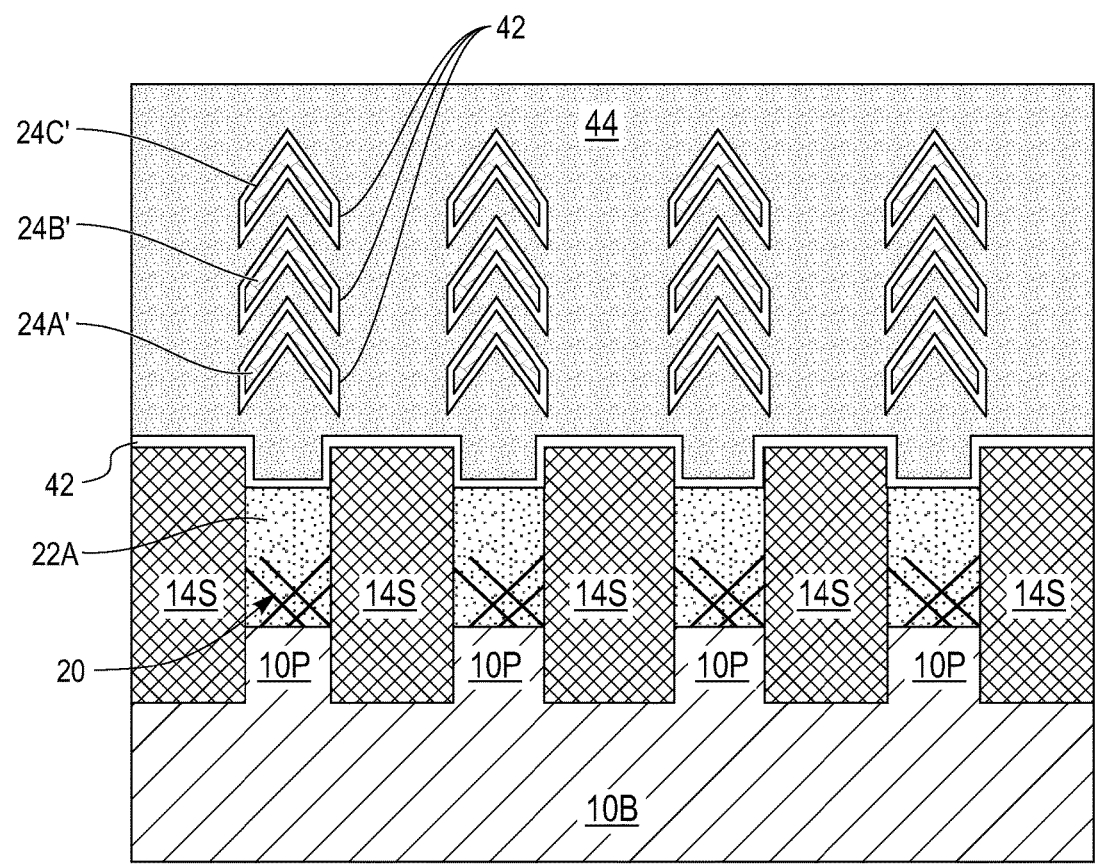

FIG. 14 is a cross sectional view (perpendicular to the fins) of an exemplary semiconductor structure of FIG. 12 after forming a functional gate structure surrounding each suspended and stacked nanosheet of the semiconductor channel material.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides a semiconductor structure that can be used for providing non-planar semiconductor devices that have improved electrostatic characteristics and increased device width per footprint area as compared with conventional FinFET devices.

Figure 1A:
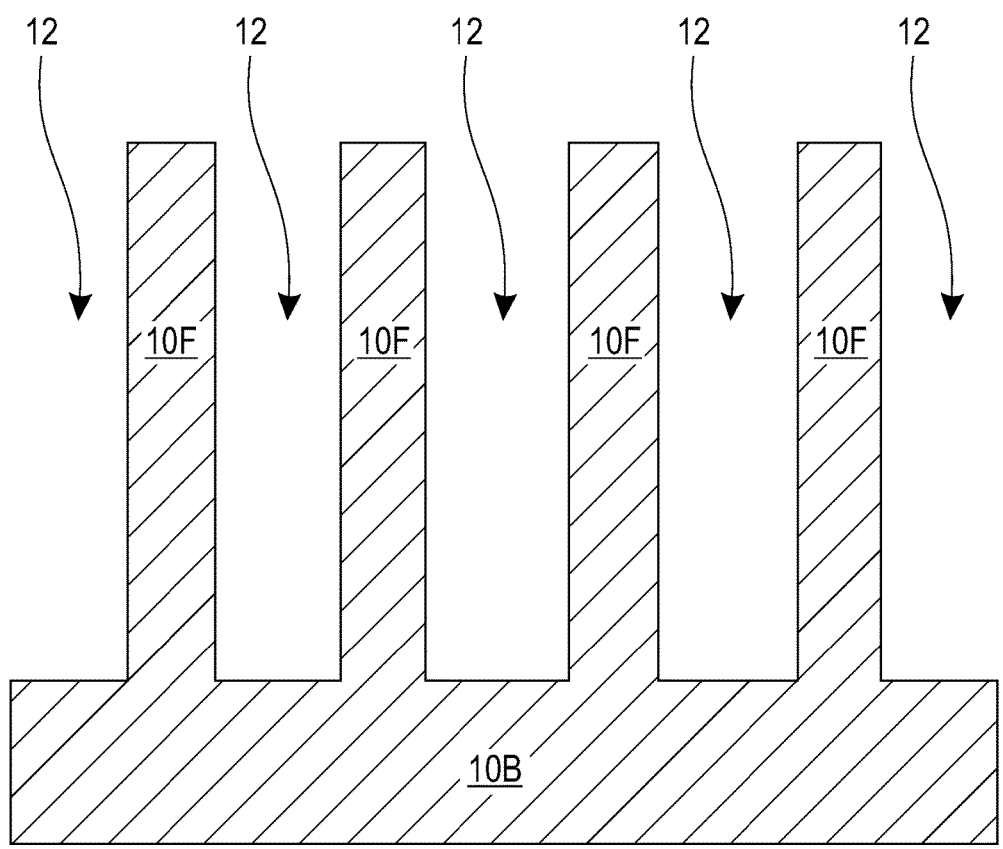
FIGS. 1A-1B are various cross sectional views (A is perpendicular to the fins, while B is parallel to one of fins) of an exemplary semiconductor structure containing a plurality of semiconductor fins extending upwards from a remaining portion of a semiconductor substrate in accordance with an embodiment of the present application.
Figure 1B:
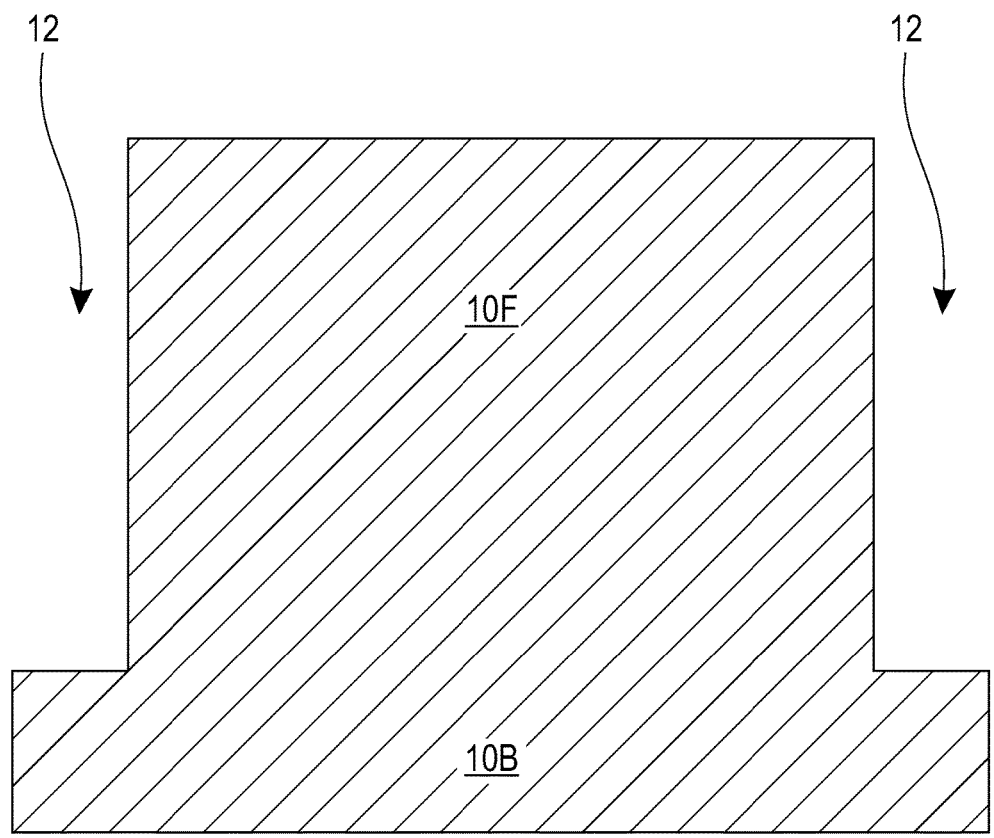

Referring first to FIGS. 1A-1B, there are shown various views of an exemplary semiconductor structure containing a plurality of semiconductor fins 10F extending upwards from a remaining portion of a semiconductor substrate (i.e., semiconductor substrate portion 10B) that can be employed in accordance with an embodiment of the present application. As is shown, a trench 12 is located adjacent each semiconductor fin 10F.

The exemplary semiconductor structure shown in FIGS. 1A-1B can be formed by first providing a semiconductor substrate (not shown). The semiconductor substrate that can be used in the present application is a bulk semiconductor substrate. By "bulk" semiconductor substrate, it is meant a substrate that is entirely composed of at least one semiconductor material that has semiconducting properties. Examples of materials that have semiconducting properties and thus can be employed as the semiconductor material that provides the semiconductor substrate include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the semiconductor substrate is composed entirely of silicon.

The at least one semiconductor material that provides the semiconductor substrate may be single crystalline, polycrystalline or amorphous. In one example, the entirety of, or at least a topmost portion of, the semiconductor substrate is composed of a single crystalline semiconductor material such as, for example, single crystalline silicon.

After providing the semiconductor substrate, the semiconductor substrate is then patterned to provide the exemplary semiconductor structure shown in FIGS. 1A-1B. In the present application, each semiconductor fin 10F is formed within an upper semiconductor material portion of the semiconductor substrate, while the semiconductor substrate portion 10B represents a remaining lower semiconductor material portion of the semiconductor substrate.

In one embodiment of the present application, the patterning used to provide the plurality semiconductor fins 10F may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In the illustrated embodiment, the etch stops within a portion of the semiconductor substrate.

In another embodiment of the present application, the patterning used to provide the plurality of semiconductor fins 10F may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

As used herein, a "semiconductor fin" refers to a remaining portion of the semiconductor substrate and including a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin 10F has a width from 5 nm to 30 nm. Other widths that are lesser than, or greater than the range mentioned herein can also be used in the present application. The height of each semiconductor 10F can be from 20 nm to 200 nm; although other heights that are lesser than, or greater than, the aforementioned range may also be employed. Each semiconductor fin 10F is spaced apart from its nearest neighboring semiconductor fin 10F by the width of one of the trenches 12. In one embodiment, the width of each of the trenches 12 is from 20 nm to 100 nm. Also, each semiconductor fin 10F is oriented parallel to each other.

Figure 2A:
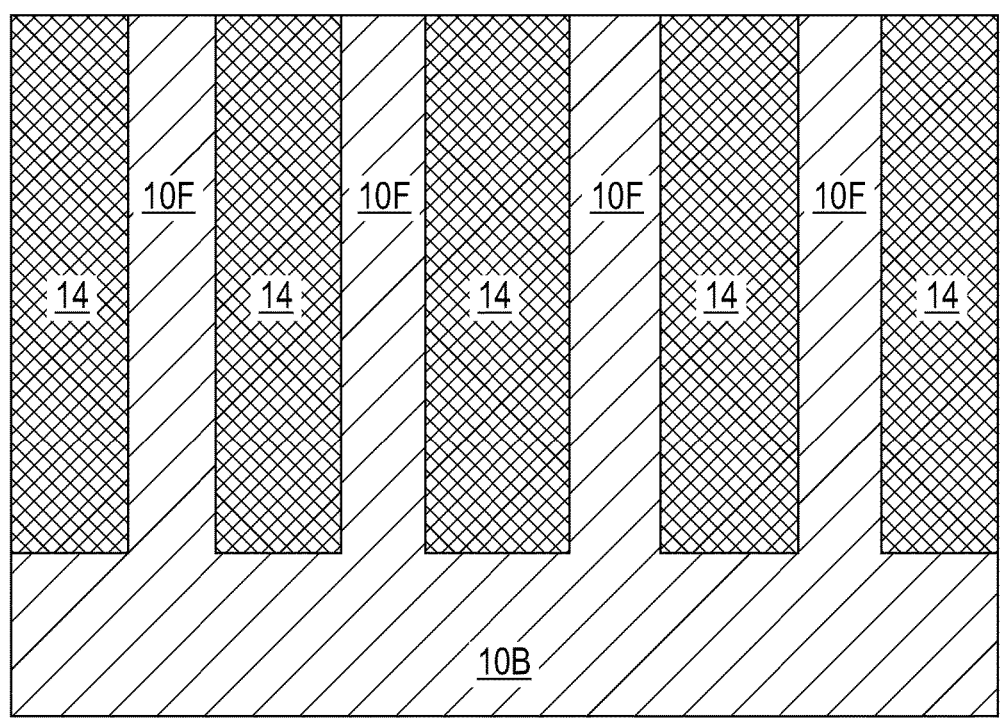
FIGS. 2A-2B are various cross sectional views (A is perpendicular to the fins, while B is parallel to one of fins) of the exemplary semiconductor structure of FIGS. 1A-1B after filling each trench that is located adjacent each semiconductor fin with a trench dielectric material.
Figure 2B:
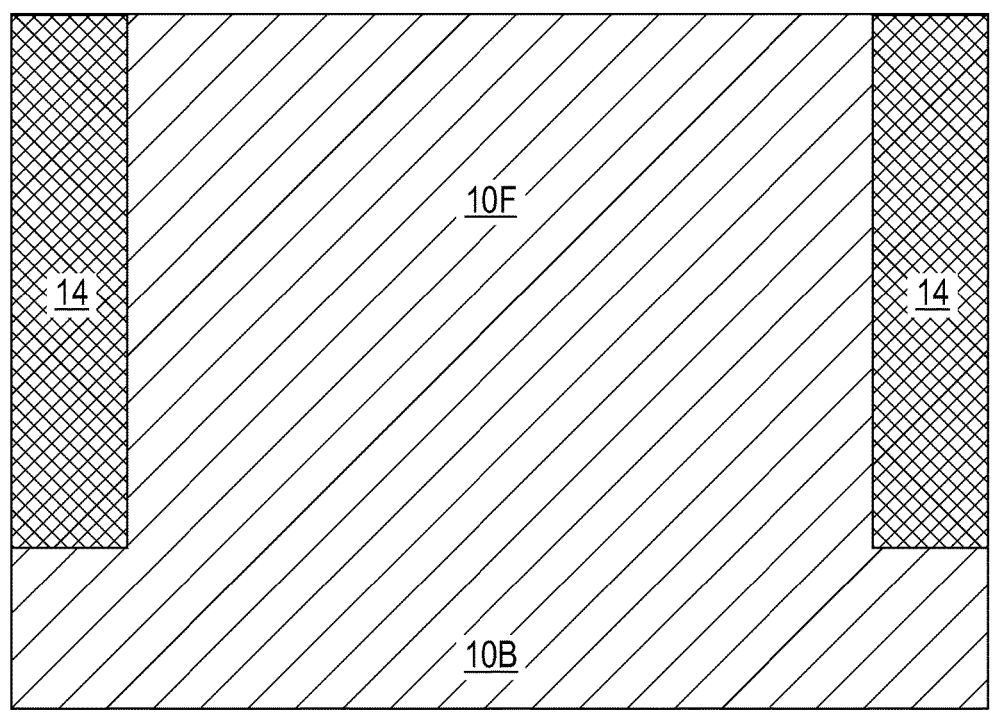

Referring now to FIGS. 2A-2B, there are illustrated various views of the exemplary semiconductor structure of FIGS. 1A-1B after filling each trench 12 that is located adjacent each semiconductor fin 10F with a trench dielectric material. Each filled trench 12 containing the trench dielectric material can be referred to herein as a trench dielectric material portion 14. As is shown, the trench dielectric material completely fills each trench 12 and a topmost surface of each trench dielectric material portion 14 is coplanar with a topmost surface of each semiconductor fin 10F.

The trench dielectric material may include a dielectric oxide and/or a dielectric nitride. In one embodiment, the trench dielectric material is composed entirely of silicon dioxide. The trench dielectric material can be formed utilizing a deposition process such as, for example, chemical vapor deposition (CVP) or plasma enhanced chemical vapor deposition (PECVD). In some embodiments, and following the deposition of the trench dielectric material, an etch back process or a planarization process such as, for example, chemical mechanical polishing (CMP) and/or grinding can be used to provide the exemplary semiconductor structure shown in FIGS. 2A-2B.

Figure 3A:
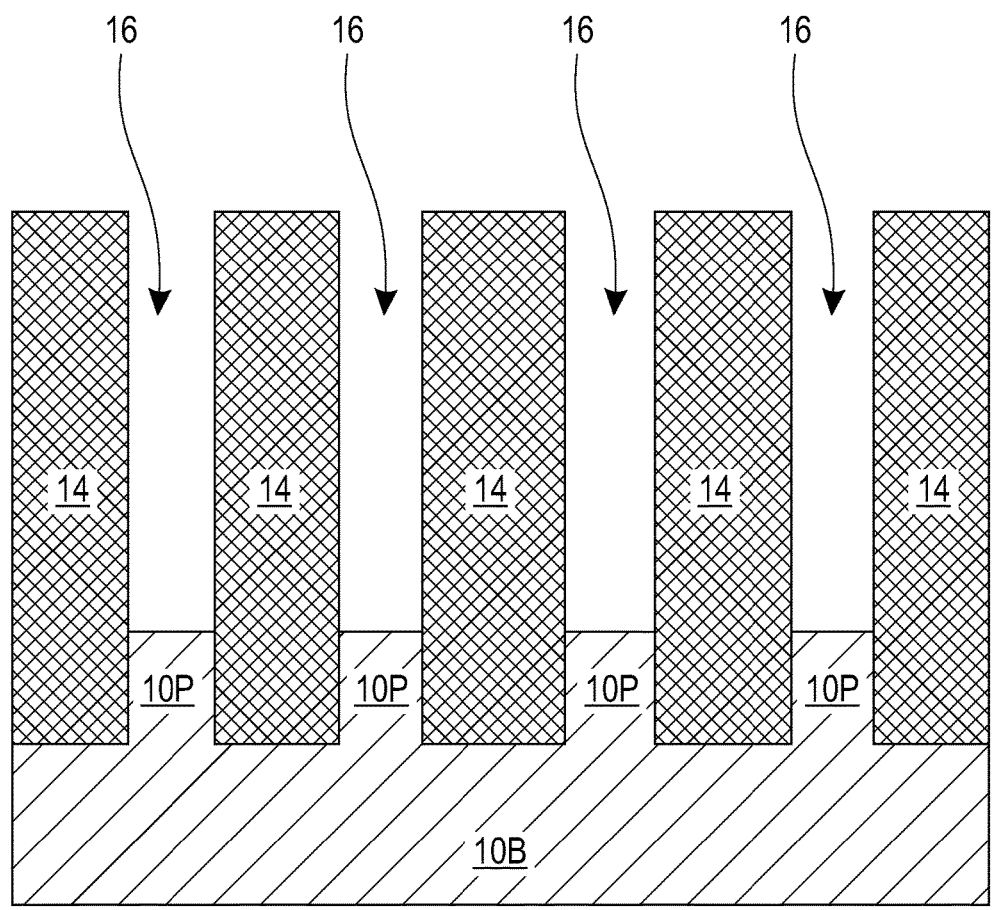
FIGS. 3A-3B are various cross sectional views (A is perpendicular to the fins, while B is parallel to one of fins) of the exemplary semiconductor structure of FIGS. 2A-2B after recessing each semiconductor fin to provide a semiconductor fin portion.
Figure 3B:
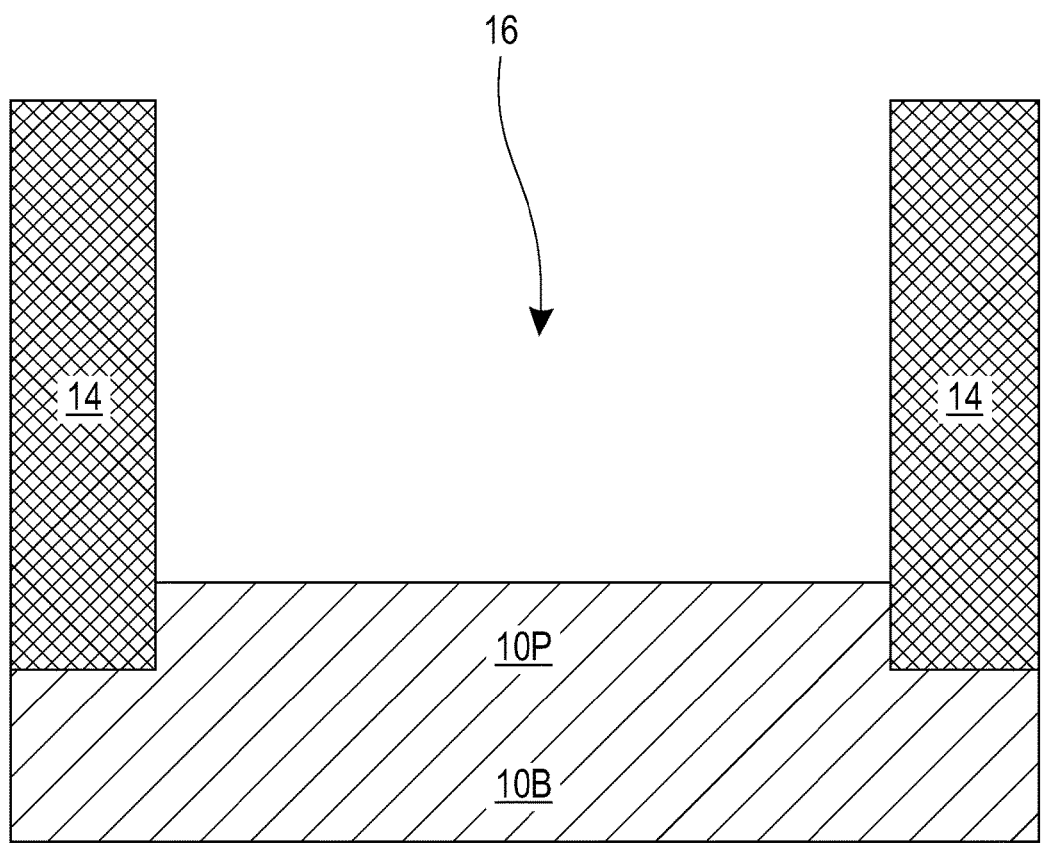

Referring now to FIGS. 3A-3B, there are illustrated various views of the exemplary semiconductor structure of FIGS. 2A-2B after recessing each semiconductor fin 10F to provide a semiconductor fin portion 10P. Each semiconductor fin portion 10P has a height that is less than the height of each semiconductor fin 10F. Each semiconductor fin portion 10P extends upwards from the semiconductor substrate portion 10B. Each semiconductor fin portion 10P is used as a growth surface during the subsequent formation of a semiconductor pillar structure.

Each semiconductor fin 10F can be recessed utilizing an anisotropic etching process such as, for example, a reactive ion etching, that is selective in removing the semiconductor material that provides each semiconductor fin 10F relative to the trench dielectric material that provides each trench dielectric material portion 14. When each semiconductor fin 10F is composed of silicon, the recessing of the silicon fins may be performed utilizing HCl gas in an epitaxial reactor, or by reactive ion etching (RIE). In some embodiments (not shown), each semiconductor fin 10F can be etched to a height of the interface between the trench dielectric material portion 14 and the semiconductor substrate portion 10B. In such an instance, semiconductor fin portions 10P are not formed and subsequent growth of the semiconductor pillar structure 18 occurs from an exposed surface of semiconductor substrate portion 10B. In yet another embodiment (not shown), each semiconductor fin 10F can be etched into semiconductor substrate portion 10B to form a 111-plane bound V-shaped bottom.

The recessing of each semiconductor fin 10F provides an aspect ratio trapping trench 16 between each trench dielectric material portion 14. Each aspect ratio trapping trench 16 has an aspect ratio (width to height) of greater than 1:3.

Figure 4A:
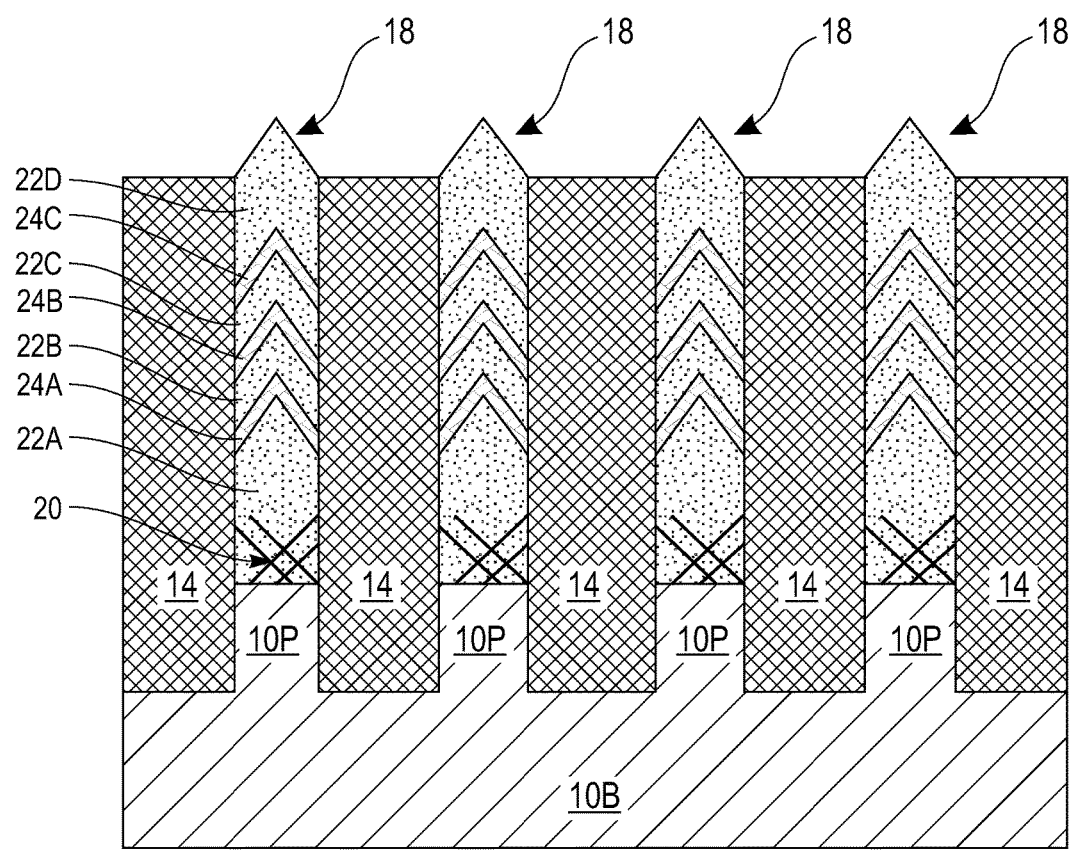
FIGS. 4A-4B are various cross sectional views (A is perpendicular to the fins, while B is parallel to one of fins) of the exemplary semiconductor structure of FIGS. 3A-3B after forming a semiconductor pillar structure from an exposed surface of each semiconductor fin portion utilizing an aspect ratio trapping process, wherein each semiconductor pillar structure includes alternating layers of a sacrificial III-V compound semiconductor material and a semiconductor channel material.
Figure 4B:
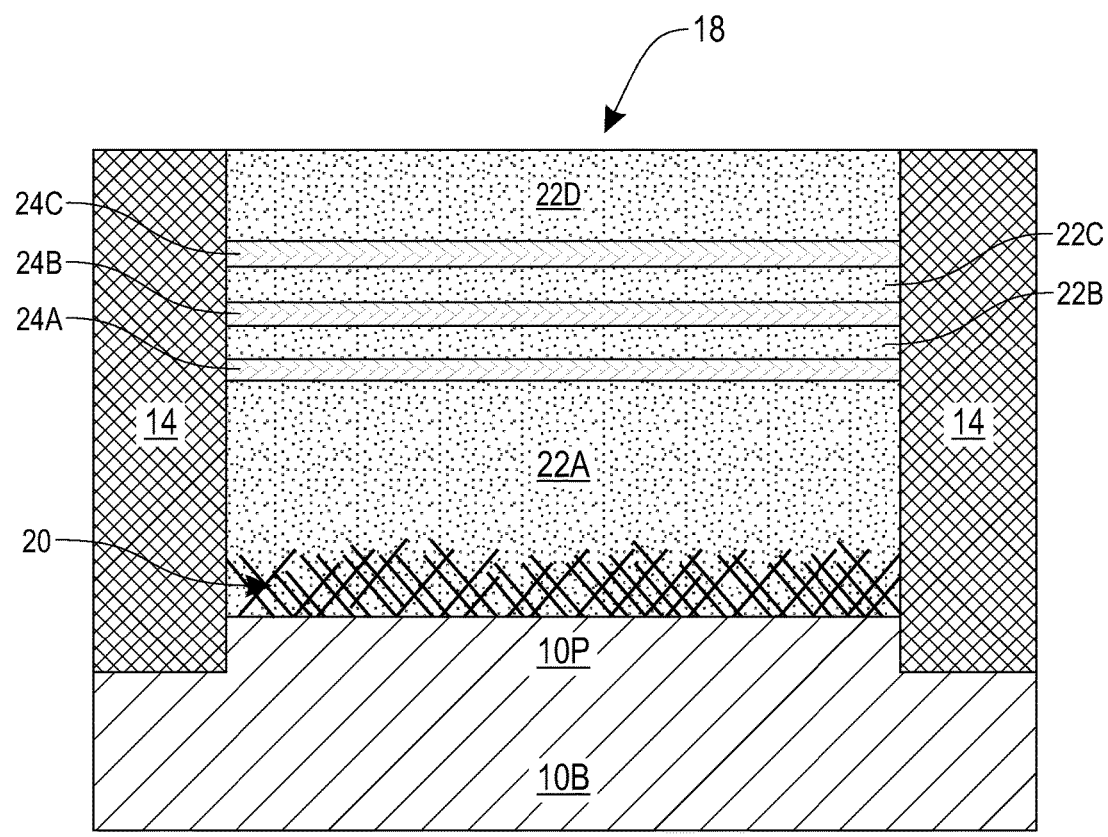

Referring now to FIGS. 4A-4B, there is illustrated various views of the exemplary semiconductor structure of FIGS. 3A-3B after forming a semiconductor pillar structure 18 from an exposed surface of each semiconductor fin portion 10P and within each aspect ratio trapping trench 16 utilizing an aspect ratio trapping process, wherein each semiconductor pillar structure 18 includes alternating layers of a sacrificial III-V compound semiconductor material (22A, 22B, 22C, 22D, etc.) and a semiconductor channel material (24A, 24B, 24C, etc). In embodiments in which no semiconductor fin portion 10P is present, the semiconductor pillar structure 18 is grown from an exposed surface of the semiconductor substrate portion 10B. In accordance with the present application, each layer of semiconductor channel material is sandwiched between a bottom layer of sacrificial III-V compound semiconductor material and a top layer of sacrificial III-V compound semiconductor material. Each semiconductor pillar structure 18 includes at least two layers of semiconductor channel material (2n, wherein n is an integer of 1 or greater) and three layers of sacrificial III-V compound semiconductor material (2n+1).

Each layer of sacrificial III-V compound semiconductor material (22A, 22B, 22C, 22D, etc.) and each layer of semiconductor channel material (24A, 24B, 24C, etc) has a topmost surface that is chevron shaped. By "chevron shaped" it is meant that each layer of sacrificial III-V compound semiconductor material (22A, 22B, 22C, 22D, etc.) and each layer of semiconductor channel material (24A, 24B, 24C, etc) has a topmost surface that is bound by 111-planes (and is thus has an inverted V-shaped pattern).

Each layer of sacrificial III-V compound semiconductor material (22A, 22B, 22C, 22D, etc.) of the semiconductor pillar structure 18 includes a same III-V compound semiconductor material. In one example, each layer of sacrificial III-V compound semiconductor material (22A, 22B, 22C, 22D, etc.) may include InP or InGaAs with an In content higher than 50 atomic %. In accordance with the present application, the bottommost layer of sacrificial III-V compound semiconductor material (i.e., 22A) has a defect region 20 that contains defects that terminate at the sidewalls of each trench dielectric material portion 14.

Each layer of semiconductor channel material (24A, 24B, 24C, etc) comprises a semiconductor material that differs from the III-V compound semiconductor material that provides each layer of sacrificial III-V compound semiconductor material (22A, 22B, 22C, 22D, etc.) and is substantially lattice matched to an underlying layer of sacrificial III-V compound semiconductor material. By "substantially lattice matched" it is meant a semiconductor material that has a lattice constant that is from ±5% from the lattice constant of the III-V compound semiconductor material that provides each layer of sacrificial III-V compound semiconductor material (22A, 22B, 22C, 22D, etc.). In some embodiments, each layer of semiconductor channel material (24A, 24B, 24C, etc) is composed of a same semiconductor material. For example, each layer of semiconductor channel material (24A, 24B, 24C, etc) may include Ge or InGaAs. In another embodiment, at least two layers of semiconductor channel material comprise a different semiconductor material. For example, one of the layers of semiconductor channel material may be composed of Ge, while another of the layers of the semiconductor channel material may be composed of InGaAs.

Each layer of sacrificial III-V compound semiconductor material (22A, 22B, 22C, 22D, etc.) of the semiconductor pillar structure 18 has a vertical thickness that is greater than a vertical thickness of each layer of channel semiconductor material (24A, 24B, 24C, etc.). In one embodiment, the vertical thickness of each layer of channel semiconductor material (24A, 24B, 24C, etc.) can be from 2 nm to 10 nm.

The aspect ratio trapping process that is used in providing each semiconductor pillar structure 18 including each layer of sacrificial III-V compound semiconductor material (22A, 22B, 22C, 22D, etc.) and each layer of semiconductor channel material (24A, 24B, 24C, etc) is an epitaxial regrowth process such as described in U.S. Patent Application Publication No. 2011/0049568 to Lochtefeld et al., the entire content of which is incorporated herein by reference. Notably, and since an epitaxial regrowth process is used in forming each semiconductor pillar structure 18 the bottommost layer of sacrificial III-V compound semiconductor material 22A has a same crystalline characteristic as the underlying semiconductor fin portion 10P or semiconductor substrate portion 10B if no semiconductor fin portion 10P is present. Moreover, each layer of sacrificial III-V compound semiconductor material (22A, 22B, 22C, 22D, etc.) and each layer of semiconductor channel material (24A, 24B, 24C, etc) present in the semiconductor pillar structure 18 would have the same crystalline characteristics as each other which in turn is the same as the crystalline characteristic of the underlying semiconductor fin portion 10P. In one embodiment of the present, each semiconductor fin portion 10P and the entirety of each semiconductor pillar structure 18 including each layer of sacrificial III-V compound semiconductor material (22A, 22B, 22C, 22D, etc.) and each layer of semiconductor channel material (24A, 24B, 24C, etc) has a surface having a <111> crystal orientation.

Each semiconductor pillar structure 18 can be formed by selective epitaxial growth in any suitable epitaxial deposition system, including, but not limited to, atmospheric-pressure CVD (APCVD), low- (or reduced-) pressure CVD (LPCVD), ultra-high-vacuum CVD (UHVCVD), by molecular beam epitaxy (MBE), metal-organic CVD (MOCVD) or by atomic layer deposition (ALD). In the CVD process, selective epitaxial growth typically includes introducing a source gas into the chamber. The source gas may include at least one precursor gas and a carrier gas, such as, for example hydrogen. The at least one precursor gas used for providing each layer of sacrificial III-V compound semiconductor material (22A, 22B, 22C, 22D, etc.) differs from the at least one source gas used for providing each layer of semiconductor channel material (24A, 24B, 24C, etc). The reactor chamber is heated, such as, for example, by radiant lamp heating. The growth temperature in the chamber may range from 250° C. to 900° C. The growth system also may utilize low-energy plasma to enhance the layer growth kinetics. The epitaxial growth system may be a single-wafer or multiple-wafer batch reactor.

As is shown, a topmost layer of sacrificial III-V compound semiconductor material (i.e., 22D) has a topmost surface that extends above a topmost surface of each trench dielectric material portion 14.

Figure 5A:
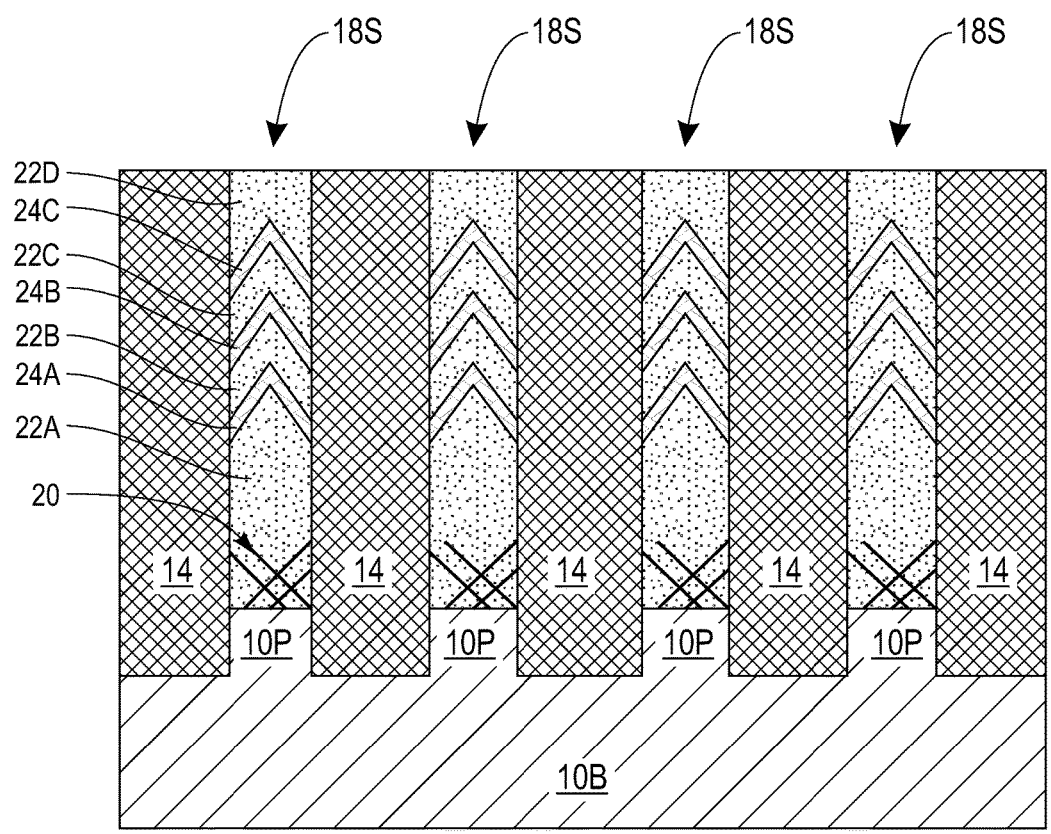
FIGS. 5A-5B are various cross sectional views (A is perpendicular to the fins, while B is parallel to one of fins) of the exemplary semiconductor structure of FIGS. 4A-4B are performing a planarization process.
Figure 5B:
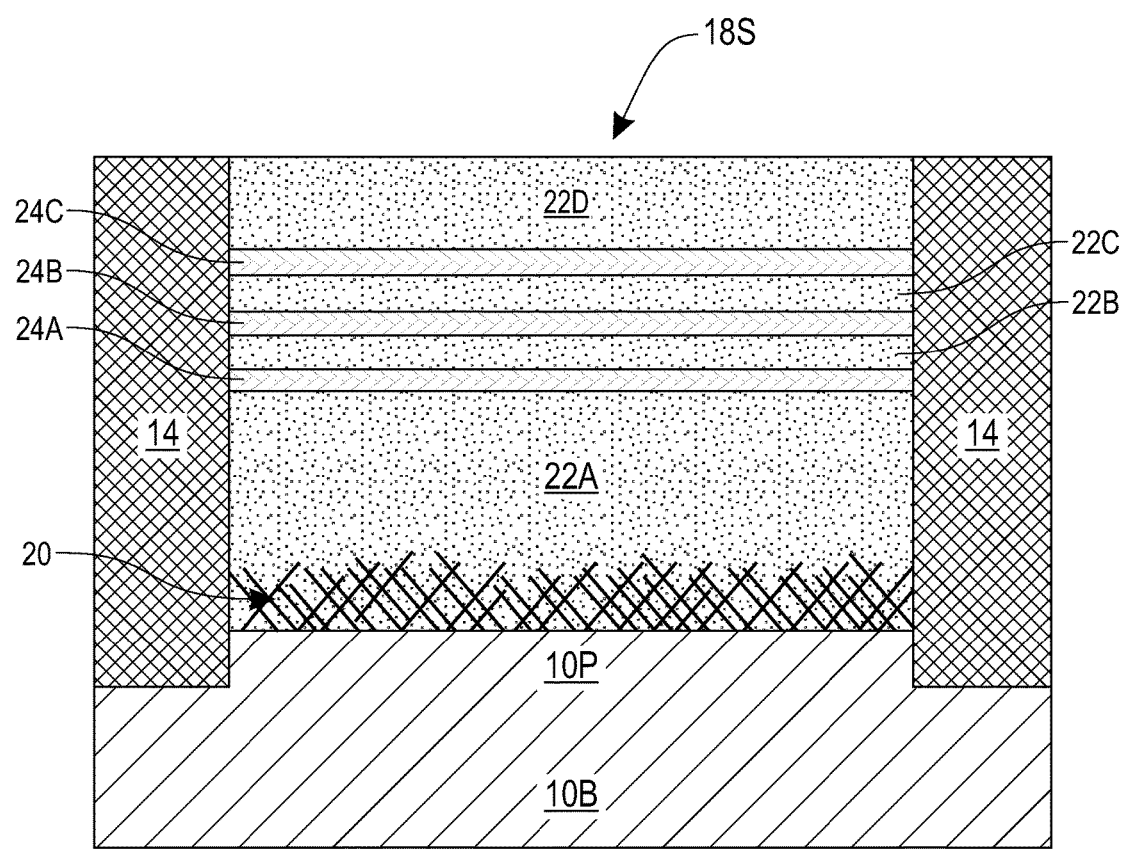

Referring now to FIGS. 5A-5B, there are illustrated various views of the exemplary semiconductor structure of FIGS. 4A-4B are performing a planarization process. The planarization process planarizes the topmost layer of sacrificial III-V compound semiconductor material (i.e., 22D) of each semiconductor pillar structure 18 so as to provide a topmost surface to the topmost layer of sacrificial III-V compound semiconductor material (i.e., 22D) that is coplanar with the topmost surface of each trench dielectric material portion 14. The planarization process that can be used to provide the exemplary semiconductor structure shown in FIGS. 5A-5B may include CMP and/or grinding.

Figure 6A:
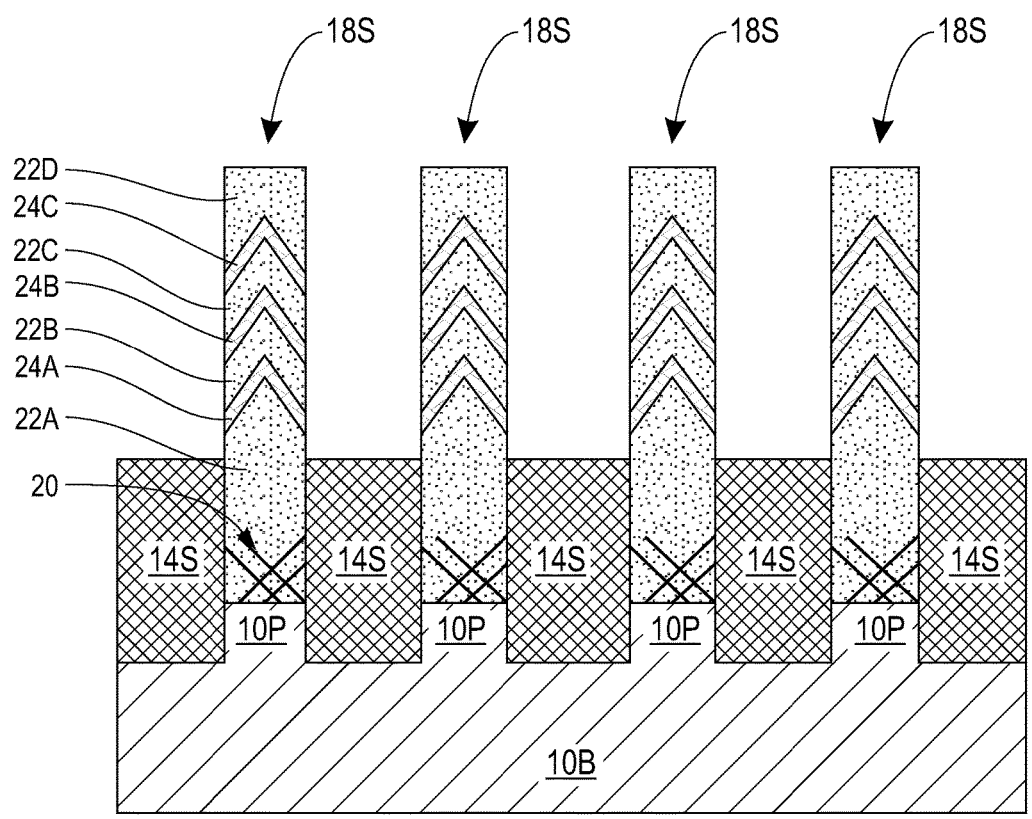
FIGS. 6A-6B are various cross sectional views (A is perpendicular to the fins, while B is parallel to one of fins) of the exemplary semiconductor structure of FIGS. 5A-5B after recessing the trench dielectric material to expose a portion of each semiconductor pillar structure and to provide a trench dielectric structure.
Figure 6B:
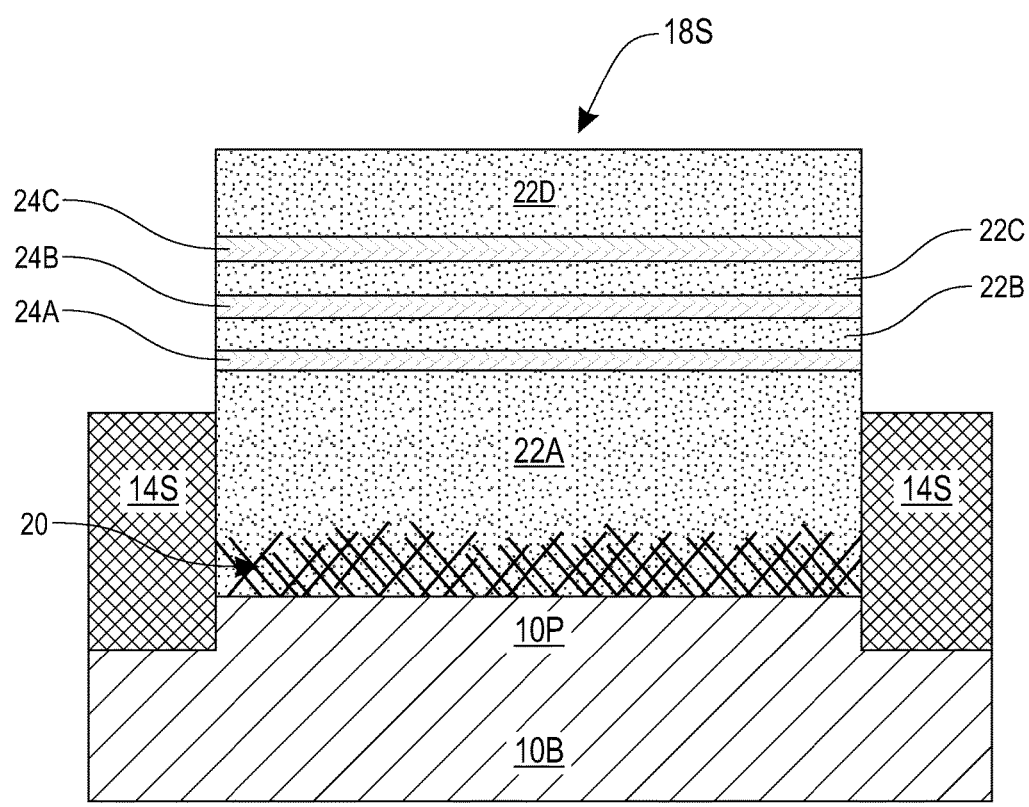

Referring now to FIGS. 6A-6B, there are illustrated various views of the exemplary semiconductor structure of FIGS. 5A-5B after recessing each trench dielectric material portion 14 to expose a portion of each semiconductor pillar structure 18 and to provide a trench dielectric structure 14S. As is shown, sidewall surfaces of each layer of semiconductor channel material (24A, 24B, 24C, etc) and sidewall surfaces of at least each layer of sacrificial III-V compound semiconductor material (22B, 22C, 22D, etc.) that overlies each layer of semiconductor channel material (24A, 24B, 24C, etc) are exposed. Also exposed is a sidewall surface of a topmost portion of the bottommost layer of sacrificial III-V compound semiconductor material (i.e., 2AB) which is present above the defect region 20.

The recessing of each trench dielectric material portion 14 may be performed utilizing an anisotropic etching process such as, for example, a reactive ion etching, that is selective in removing trench dielectric material that provides each trench dielectric material portion 14 relative to semiconductor pillar structure 18. In one example, and when each trench dielectric material portion 14 is composed of silicon dioxide, the recessing of each trench dielectric material portion 14 may be performed utilizing RIE or wet etching.

Figure 7A:
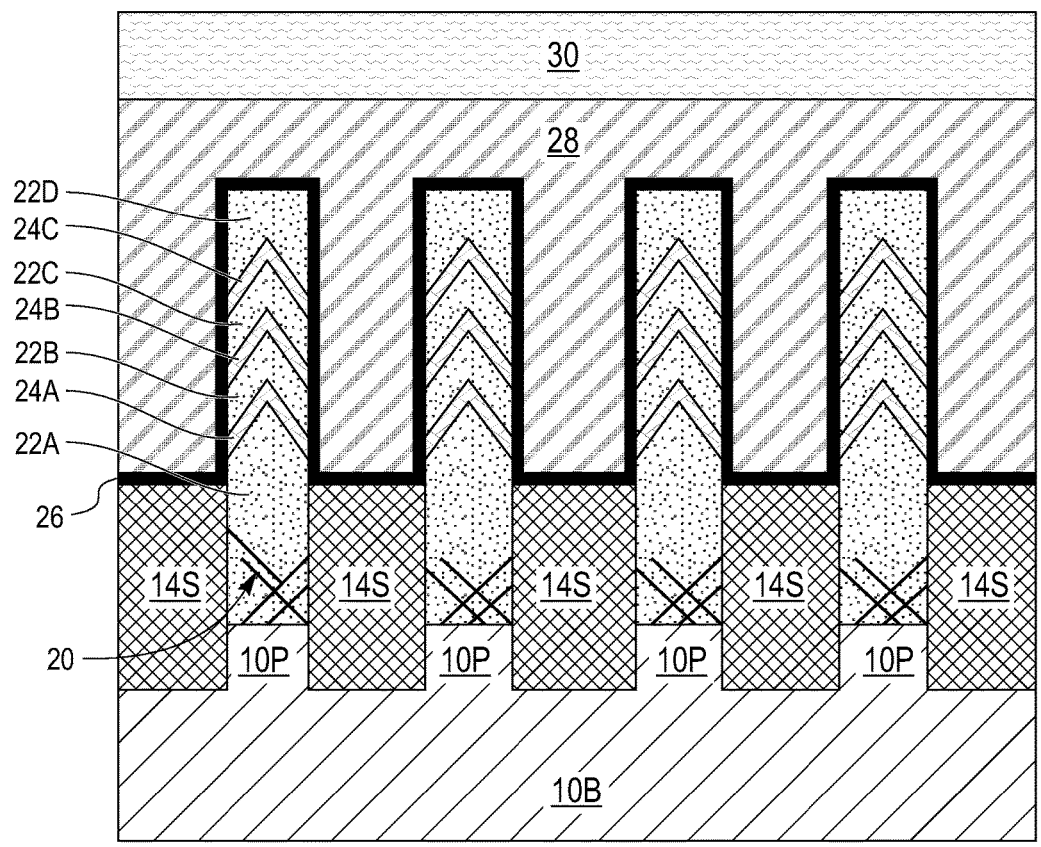
FIGS. 7A-7B are various cross sectional views (A is perpendicular to the fins, while B is parallel to one of fins) of the exemplary semiconductor structure of FIGS. 6A-6B after forming a dielectric liner and a plurality of sacrificial gate structures containing, from bottom to top, a sacrificial gate portion and a sacrificial hard mask portion.
Figure 7B:
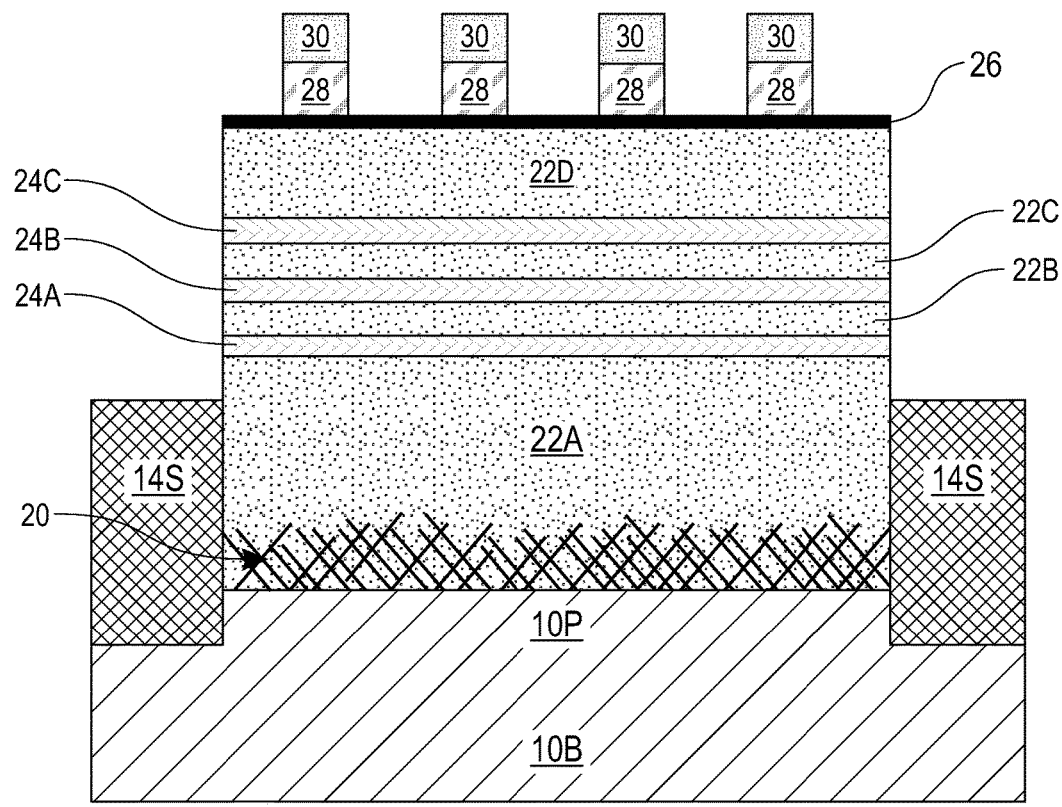

Referring now to FIGS. 7A-7B, there are illustrated various views of the exemplary semiconductor structure of FIGS. 6A-6B after forming a dielectric liner 26 and a plurality of sacrificial gate structures containing, from bottom to top, a sacrificial gate portion 28 and a sacrificial hard mask portion 30.

The dielectric liner 26 that may be employed in the present application can include any dielectric material such as a dielectric oxide, nitride, and/or oxynitride; the dielectric liner 26 typically comprises a different dielectric material than the trench dielectric material. In one example, the dielectric material that provides the dielectric liner 26 may be composed of silicon nitride or silicon oxynitride. In some embodiments, the dielectric liner 26 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered dielectric liner 26 comprising different dielectric materials, e.g., silicon dioxide, and a high-k gate dielectric, can be formed and used as the dielectric liner 26. The dielectric material used in providing the dielectric liner 26 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the dielectric material used in providing the dielectric liner 26 can have a thickness in a range from 1 nm to 10 nm. Other thicknesses that are lesser than, or greater than, the aforementioned thickness range can also be employed for the dielectric material that may provide the dielectric liner 26.

The sacrificial gate portion 28 can include a gate conductor material or any another material that can be etched selective to the dielectric spacer 32 to be subsequently formed. The gate conductor material used in providing the sacrificial gate portion 28 can include, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The material used in providing the sacrificial gate portion 28 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the material used in providing the sacrificial gate portion 28 has a thickness from 50 nm to 200 nm. Other thicknesses that are lesser than, or greater than, the aforementioned thickness range can also be employed for the material used in providing sacrificial gate portion 28.

Sacrificial hard mask portion 30 may include any hard mask material. In one embodiment, the hard mask material that can provide the sacrificial hard mask portion 30 may include silicon dioxide, silicon nitride, and/or silicon oxynitride. The hard mask material that provides the sacrificial hard mask portion 30 may be the same as, or different from, the dielectric material that provides the dielectric liner 26. The hard mask material that provides the sacrificial hard mask portion 30 can be formed utilizing a conventional deposition process such as, for example, chemical vapor deposition or plasma enhanced chemical vapor deposition. The hard mask material that provides the sacrificial hard mask portion 30 can have a thickness from 5 nm to 20 nm. Other thicknesses that are lesser than, or greater than, the aforementioned thickness range can also be employed as the thickness of the hard mask material that provides the sacrificial hard mask portion 30.

Each sacrificial gate structure including the sacrificial gate portion 28 and the sacrificial hard mask portion 30 can be formed by providing a sacrificial material stack of, from bottom to top, the material that provides the sacrificial gate portion 28 and a hard mask material. A patterning process that includes lithography and etching may follow the formation of the material stack.

Figure 8:
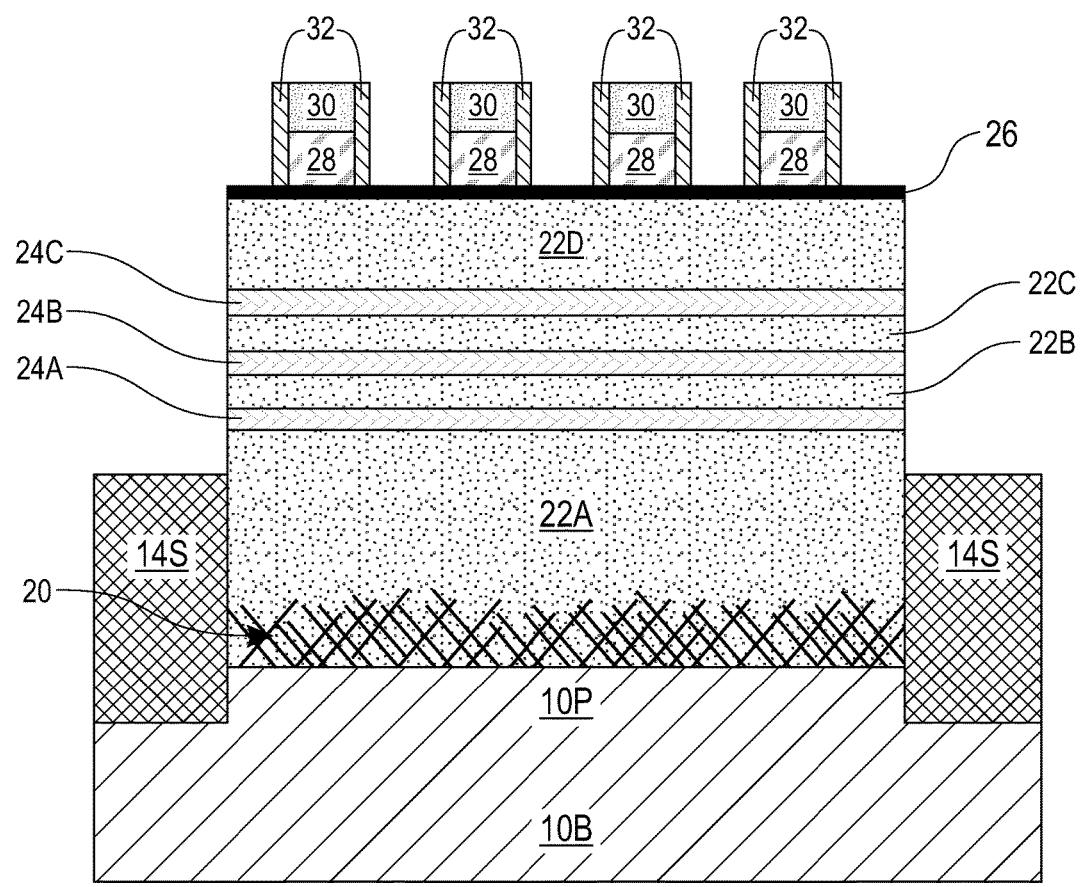
FIG. 8 is a cross sectional view (parallel to one of the fins) of the exemplary semiconductor structure of FIGS. 7A-7B after forming a dielectric spacer on each sidewall surface of each sacrificial gate structure.

Referring now to FIG. 8, there is illustrated a view of the exemplary semiconductor structure of FIGS. 7A-7B after forming a dielectric spacer 32 on each sidewall surface of each sacrificial gate structure. Although not shown, the dielectric spacer 32 straddles each semiconductor pillar structure 18 such that a portion of the dielectric spacer 32 is present upon a sidewall portion of each semiconductor pillar structure 18. The dielectric spacer 32 may be formed by first providing a dielectric spacer material such as, for example, silicon dioxide, silicon nitride and/or silicon oxynitride. The dielectric spacer material typically, but not necessarily always, includes a different material than either the dielectric liner 26 or the sacrificial hard mask portion 30. Following deposition of the dielectric spacer material, a spacer etch can be formed to provide the dielectric spacer 32.

Figure 9:
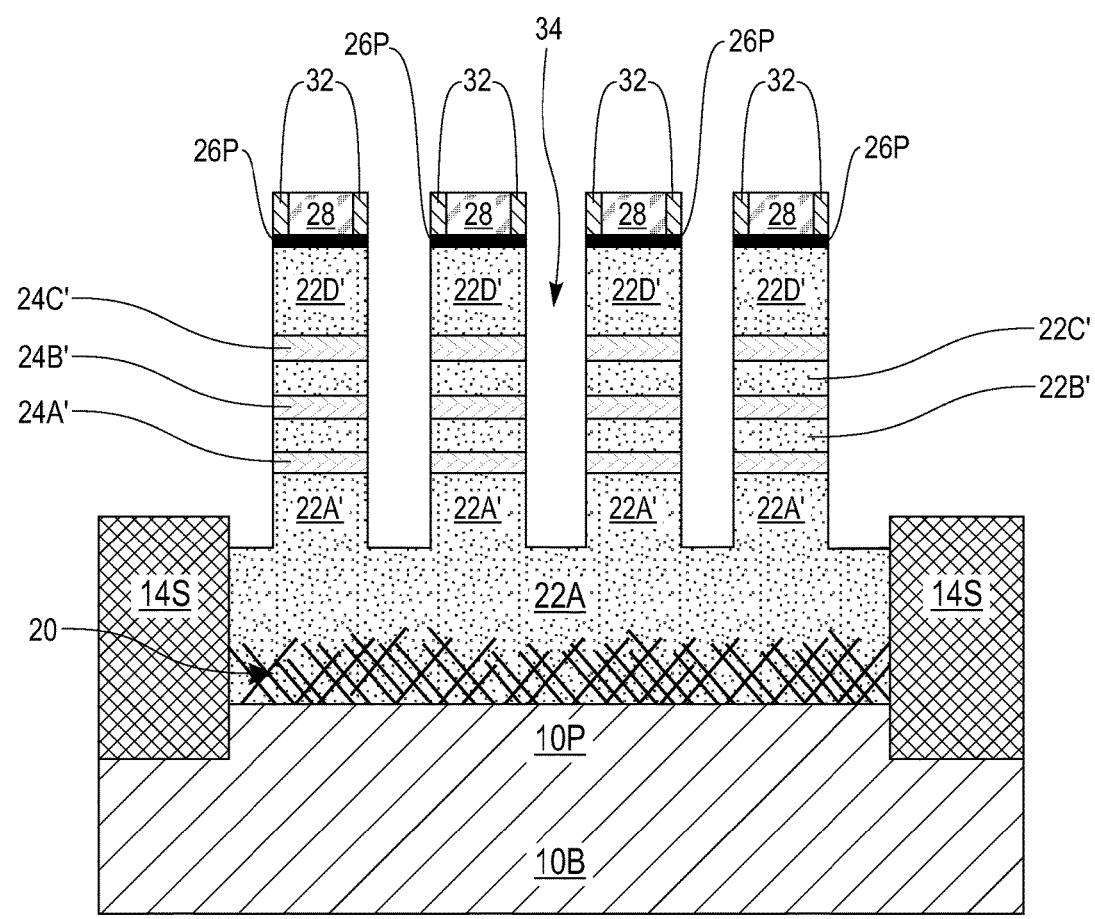
FIG. 9 is a cross sectional view (parallel to one of the fins) of the exemplary semiconductor structure of FIG. 8 after etching exposed portions of each semiconductor pillar structure not covered by the dielectric spacer and the sacrificial gate structure.

Referring now to FIG. 9, there is illustrated the exemplary semiconductor structure of FIG. 8 after etching exposed portions of each semiconductor pillar structure 18 not covered by the dielectric spacer 32 and each sacrificial gate structure. During the etch, exposed portions of the dielectric liner 26 are also removed. The remaining portion of the dielectric liner 26 is now referred to herein as a dielectric liner portion 26P. The dielectric liner portion 26 is present beneath each dielectric spacer 32 and beneath the sacrificial gate portion 28 of each sacrificial gate structure.

The remaining portion of each semiconductor pillar structure may be referred to herein as semiconductor nanosheet structure. Each semiconductor nanosheet structure includes a remaining portion of each layer of sacrificial III-V compound semiconductor material (22A, 22B, 22C, 22D, etc.) and a remaining portion of each layer of semiconductor channel material (24A, 24B, 24C, etc). Each remaining portion of each layer of sacrificial III-V compound semiconductor material (22A, 22B, 22C, 22D, etc.) is now referred to herein as a sacrificial nanosheet of sacrificial III-V compound semiconductor material (22A', 22B', 22C', 22D', etc.), while each remaining portion of each layer of semiconductor channel material (24A, 24B, 24C, etc) is now referred to herein as a nanosheet of semiconductor channel material (24A', 24B', 24C', etc). As is shown, the etch used to provide the exemplary semiconductor structure shown in FIG. 9 stops within the bottommost layer of the sacrificial III-V compound semiconductor material (i.e., 22A). The bottommost layer of the sacrificial III-V compound semiconductor material that remains may be referred to herein as a pillar of a sacrificial III-V compound semiconductor material.

The width of each sacrificial nanosheet of sacrificial III-V compound semiconductor material (22A', 22B', 22C', 22D', etc.) and the width of each nanosheet of semiconductor channel material (24A', 24B', 24C', etc) can be from 10 nm to 60 nm.

The etch used to provide the exemplary semiconductor structure shown in FIG. 9 includes an anisotropic etching process. This etch provides cavities for subsequent formation of a source/drain semiconductor material. Following the etch, a planarization process can be used to remove each sacrificial hard mask portion 30 and a topmost portion of each dielectric spacer 32.

Figure 10:
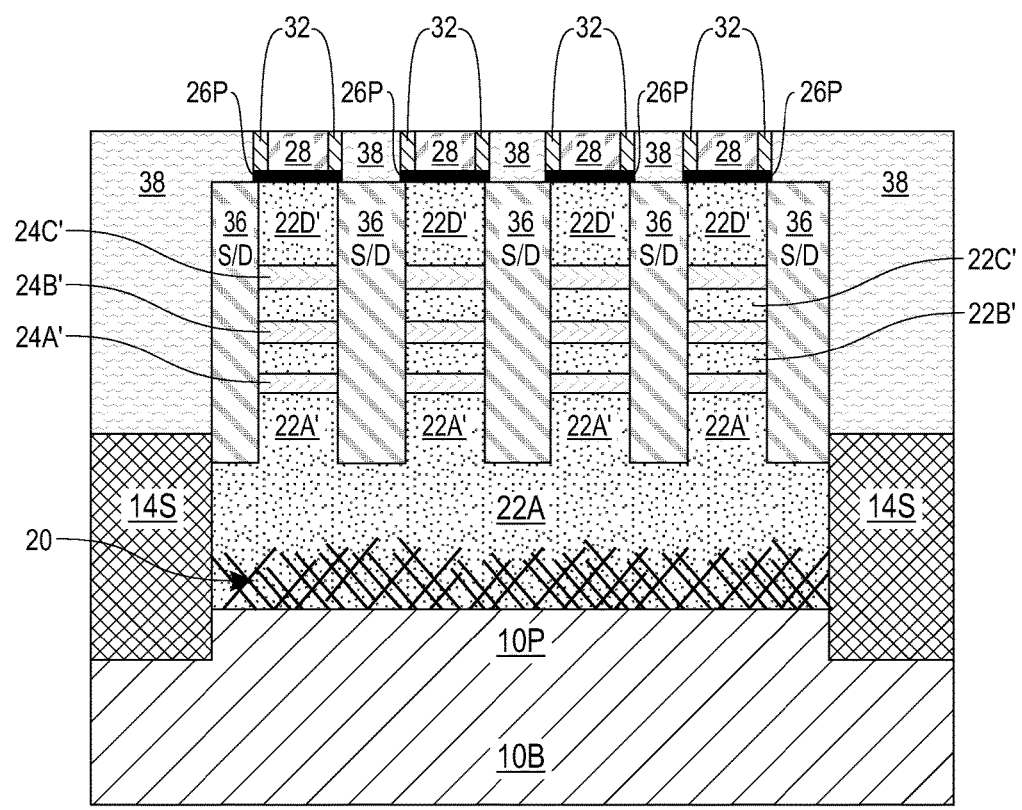
FIG. 10 is a cross sectional view (parallel to one of the fins) of the exemplary semiconductor structure of FIG. 9 after epitaxially growing a source/drain semiconductor material and subsequent formation of a dielectric material having a topmost surface that is coplanar with a topmost surface of the sacrificial gate structure.

Referring now to FIG. 10, there is illustrated the exemplary semiconductor structure of FIG. 9 after epitaxially growing a source/drain semiconductor material 36S/D and subsequent formation of a dielectric material 38 having a topmost surface that is coplanar with a topmost surface of sacrificial gate portion 28 of each the sacrificial gate structure.

The source/drain semiconductor material 36S/D can be formed utilizing an epitaxial growth (or deposition) process. The source/drain semiconductor material 36S/D grows from exposed sidewall surfaces of each semiconductor nanosheet structure. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the source/drain semiconductor material 36S/D can be performed utilizing any well known precursor gas or gas mixture. Carrier gases like hydrogen, nitrogen, helium and argon can be used.

The source/drain semiconductor material 36S/D includes a semiconductor material and a dopant. The semiconductor material that provides the source/drain semiconductor material 36S/D can be selected from one of the semiconductor materials mentioned above for the semiconductor substrate. The dopant can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in the source/drain semiconductor material 36S/D can be introduced into the precursor gas that provides the source/drain semiconductor material 36S/D. In another embodiment, the dopant can be introduced into an intrinsic layer of source/drain semiconductor material 36S/D by utilizing one of ion implantation or gas phase doping.

Dielectric material 38 may also be referred to herein as planarized (or middle-of-the-line) dielectric material. Dielectric material 38 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as dielectric material 38. The use of a self-planarizing dielectric material as dielectric material 38 may avoid the need to perform a subsequent planarizing step.

In one embodiment, the dielectric material 38 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as dielectric material 38, a planarization process or an etch back process follows the deposition of the dielectric material 38. The thickness of the dielectric material 38 that can be employed in the present application may vary depending on the type of dielectric material employed as well as the method that was employed in forming the same. In one embodiment, the dielectric material has a thickness from 80 nm to 500 nm. Other thicknesses that are greater or lesser than the range provided above can also be used for the dielectric material 38.

Figure 11:
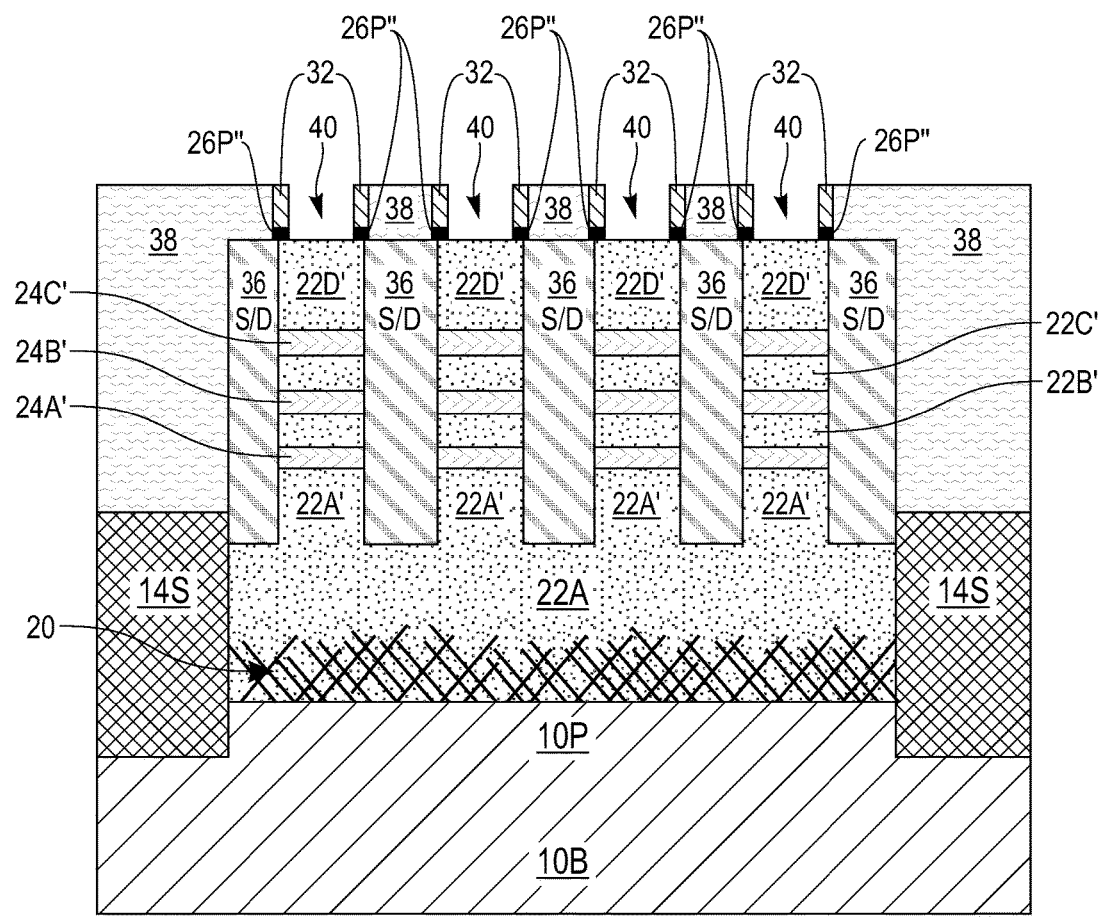
FIG. 11 is a cross sectional view (parallel to one of the fins) of the exemplary semiconductor structure of FIG. 10 after removing each sacrificial gate structure and the underlying portion of the dielectric liner to expose a topmost surface of each remaining portion of the semiconductor pillar structure.

Referring now to FIG. 11, there is illustrated the exemplary semiconductor structure of FIG. 10 after removing the sacrificial gate portion 28 of each sacrificial gate structure and the underlying portion of the dielectric liner (i.e., dielectric liner portion 26P) to expose a topmost surface of each remaining portion of the semiconductor pillar structure (i.e., the semiconductor nanosheet structure). A plurality of pre-gate cavities 40 is formed. The removal of the sacrificial gate portion 28 of each sacrificial gate structure and the dielectric liner portion 26P can be performed utilizing one or more anisotropic etching processes. After removing the sacrificial gate portion 28 of each sacrificial gate structure and the dielectric liner portion 26P, a portion of the dielectric liner portion 26P remains beneath each dielectric spacer 32. The remaining portion of the dielectric liner portion 26P can be referred to herein as a dielectric liner spacer portion 26".

Referring now to FIG. 12, there is illustrated the exemplary semiconductor structure of FIG. 11 after removing each remaining portion of the sacrificial III-V compound semiconductor material (22A', 22B', 22C', 22D', etc) to provide suspended and stacked nanosheets of the semiconductor channel material (24A', 24B', 24C', etc). The removal of each remaining portion of the sacrificial III-V compound semiconductor material (22A', 22B', 22C', 22D', etc) of the semiconductor nanosheet structure can be performed utilizing a wet etch process that is selective in removing a III-V compound semiconductor material relative to a semiconductor channel material, as described above. The suspended and stacked nanosheets of the semiconductor channel material (24A', 24B', 24C', etc) are located above a remaining portion of the bottommost layer of sacrificial III-V compound semiconductor material 22A. The removal of each remaining portion of the sacrificial III-V compound semiconductor material (22A', 22B', 22C', 22D', etc) of the semiconductor nanosheet structure provides a plurality of gate cavities 40E.

Figure 13:
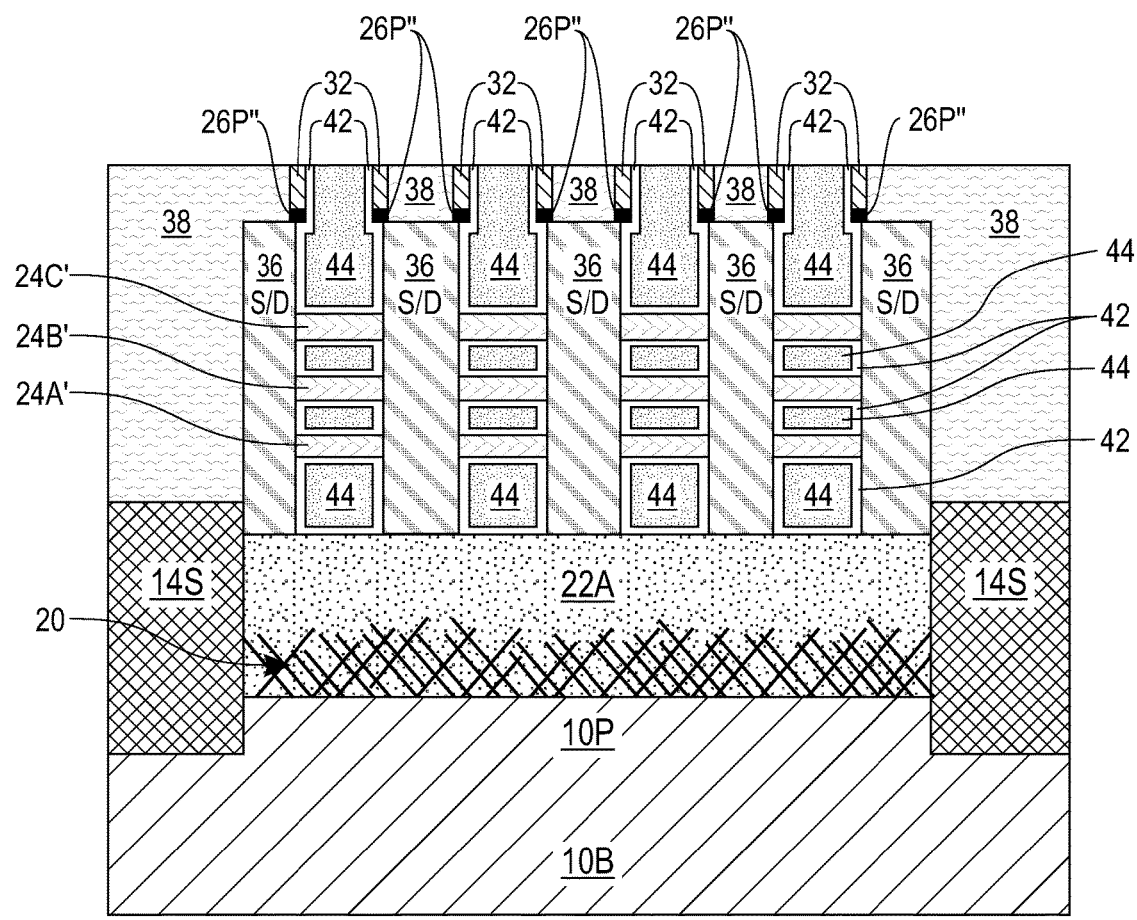
FIG. 13 is a cross sectional view (parallel to one of the fins) of an exemplary semiconductor structure of FIG. 12 after forming a functional gate structure surrounding each suspended and stacked nanosheet of the semiconductor channel material.

Referring now to FIGS. 13-14, there are illustrated various views of the exemplary semiconductor structure of FIG. 12 after forming a functional gate structure surrounding each suspended and stacked nanosheet of the semiconductor channel material (24A', 24B', 24C', etc). The functional gate structure includes a gate dielectric portion 42 and a gate conductor portion 44. The gate dielectric portion 42 may include one of the dielectric materials mentioned above for dielectric liner 26. The gate dielectric portion 42 can be formed utilizing a deposition process as described above in providing the dielectric liner 26. The gate dielectric portion 42 may also have a thickness with the thickness range mentioned above for the dielectric liner 26. The gate conductor portion 44 may include one of the gate conductor materials mentioned above in providing the sacrificial gate portion 28. The gate conductor portion 44 can be formed utilizing one of the deposition processes mentioned above for forming the gate conductor material used in providing the sacrificial gate portion 28. A planarization process can be used to provide the exemplary semiconductor structure shown in FIGS. 13-14.

In some embodiments, some of the functional gate structures are n-type functional gate structures, while the other functional gate structures are p-type functional gate structure. In such an embodiment, block mask technology may be used to provide the different conductivity type functional gate structures. In some embodiments, each suspended and stacked nanosheet of the semiconductor channel material (24A', 24B', 24C', etc) has a <111> crystal orientation and the different conductivity type transistors are formed around such suspended and stacked nanosheet of the semiconductor channel material (24A', 24B', 24C', etc).

Notably, FIGS. 13 and 14 illustrates a semiconductor structure of the present application that includes a plurality of suspended and stacked nanosheets of semiconductor channel material (24A', 24B', 24C', etc.) located above a pillar of a sacrificial III-V compound semiconductor material 22A. Each semiconductor channel material (24A', 24B', 24C', etc.) comprises a semiconductor material that is substantially lattice matched to, but different from, the sacrificial III-V compound semiconductor material 22A, and each suspended and stacked nanosheet of semiconductor channel material (24A', 24B', 24C', etc.) has a chevron shape. A functional gate structure (42, 44) can be formed around each suspended and stacked nanosheet of semiconductor channel material (24A', 24B', 24C', etc.).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a plurality of suspended and stacked nanosheets of semiconductor channel material located above a pillar of a sacrificial III-V compound semiconductor material, wherein each semiconductor channel material comprises a semiconductor material that is substantially lattice matched to, but different from, said sacrificial III-V compound semiconductor material, and each suspended and stacked nanosheet of semiconductor channel material has a chevron shape.

2. The semiconductor structure of claim 1, wherein each pillar of said sacrificial III-V compound semiconductor material is located on a topmost surface of a semiconductor fin portion that extends upwards from a semiconductor substrate portion.

3. The semiconductor structure of claim 2, wherein each pillar of said sacrificial III-V compound semiconductor material and each semiconductor fin portion is surrounded by a trench dielectric material structure.

4. The semiconductor structure of claim 3, wherein a sidewall surface of a topmost portion of said trench dielectric material structure extends above a topmost surface of each pillar of said sacrificial III-V compound semiconductor material.

5. The semiconductor structure of claim 3, wherein a bottommost surface of said semiconductor channel material is laterally offset from a topmost surface of said trench dielectric material structure.

6. The semiconductor structure of claim 3, wherein each pillar of said sacrificial III-V compound semiconductor material contains a defect region, said defect region containing defects that terminate at a sidewall of said trench dielectric material structure.

7. The semiconductor structure of claim 1, wherein each semiconductor channel material comprises Ge or InGaAs.

8. The semiconductor structure of claim 1, wherein each semiconductor channel material has a surface having a <111> crystal orientation.

9. The semiconductor structure of claim 1, further comprising a functional gate structure surrounding said plurality of suspended and stacked nanosheets of semiconductor channel material.

10. The semiconductor structure of claim 9, wherein said functional gate structure comprises a gate conductor portion, said gate conductor portion has a topmost surface that is coplanar with a topmost surface of a dielectric material located laterally adjacent to said functional gate structure.

11. The semiconductor structure of claim 9, further comprising a source/drain semiconductor material located laterally adjacent and on each side of said plurality of suspended and stacked nanosheets of semiconductor channel material.

12. The semiconductor structure of claim 11, further comprising a dielectric liner spacer portion located above said source/drain semiconductor material, and a dielectric spacer disposed above said dielectric liner spacer portion, wherein a topmost surface of said functional gate structure is coplanar with a topmost surface of said dielectric spacer.

13. The semiconductor structure of claim 1, further comprising a first functional gate structure surrounding a first set of said suspended and stacked nanosheets of semiconductor channel material, and a second functional gate structure surrounding a second set of said suspended and stacked nanosheets of semiconductor channel material.

14. The semiconductor structure of claim 13, further comprising a source/drain semiconductor material located on each side of said first set and second set of said suspended and stacked nanosheets of semiconductor channel material.

15. The semiconductor structure of claim 14, further comprising a dielectric material located laterally adjacent to at least one of source/drain semiconductor materials.

16. The semiconductor structure of claim 15, wherein said dielectric material has a topmost surface that is coplanar with a topmost surface of a functional gate structure.

* * * * *